United States Patent [19]

Kuehnert

[11] Patent Number: 4,722,256
[45] Date of Patent: Feb. 2, 1988

[54] METHOD AND APPARATUS FOR GRIPPING AND CUTTING A LAMINATION FILM

[75] Inventor: Egbert Kuehnert, Erzhausen, Fed. Rep. of Germany

[73] Assignee: Hoechst Aktiengesellschaft, Frankfurt am Main, Fed. Rep. of Germany

[21] Appl. No.: 837,762

[22] Filed: Mar. 10, 1986

[30] Foreign Application Priority Data

Mar. 26, 1985 [DE] Fed. Rep. of Germany ....... 3510852

[51] Int. Cl.⁴ .......................... B26D 3/00; B26D 5/20
[52] U.S. Cl. .......................................... 83/42; 83/152;
83/171; 83/277; 83/409; 83/415; 83/422;
83/435.1; 83/437; 226/95; 226/162
[58] Field of Search ................. 83/13, 15, 35, 42, 152,
83/171, 276, 277, 409, 415, 422, 435.1, 437;
271/195, 267; 226/95, 158, 162

[56] References Cited

U.S. PATENT DOCUMENTS

| | | | |
|---|---|---|---|
| 3,222,969 | 12/1965 | Clausen | 83/152 |
| 3,701,297 | 10/1972 | Kovic | 83/13 |
| 3,955,452 | 5/1976 | Fischer | 83/171 |
| 4,082,261 | 4/1978 | Johannisson et al. | 83/152 |
| 4,183,451 | 1/1980 | Gageur | 226/95 |

FOREIGN PATENT DOCUMENTS

| | | |
|---|---|---|
| 0040842 | 12/1981 | European Pat. Off. . |
| 0040843 | 12/1981 | European Pat. Off. . |
| 0041642 | 12/1981 | European Pat. Off. . |
| 3429429 | 12/1985 | Fed. Rep. of Germany . |

Primary Examiner—Paul A. Bell
Assistant Examiner—Scott A. Smith
Attorney, Agent, or Firm—Schwartz, Jeffery, Schwaab, Mack, Blumenthal & Evans

[57] ABSTRACT

A gripper mechanism having at least two vacuum grippers which are horizontally displaceable and fixable along a cross strut of the gripper mechanism. The gripper mechanism is vertically movable up and down and includes a blow pipe which extends over the width of the cross strut and from which an air stream is expelled. The air stream presses the photoresist-free reverse side of the photoresist film to be held and transported against the vacuum grippers. As soon as the vacuum grippers are subjected to a vacuum, the photoresist film is held and transported downwardly. On the upper side of the blow pipe are arranged stop screws which come into contact upon elevation of the gripper mechanism with the underside of vertically displaceable fastening elements, to which a cutting bar with a cutting groove is fastened. Upon elevation of the gripper mechanism, the cutting bar is taken up with it, the photoresist film being raised by the taper of the cutting bar from the suction plate which is under a vacuum.

13 Claims, 3 Drawing Figures

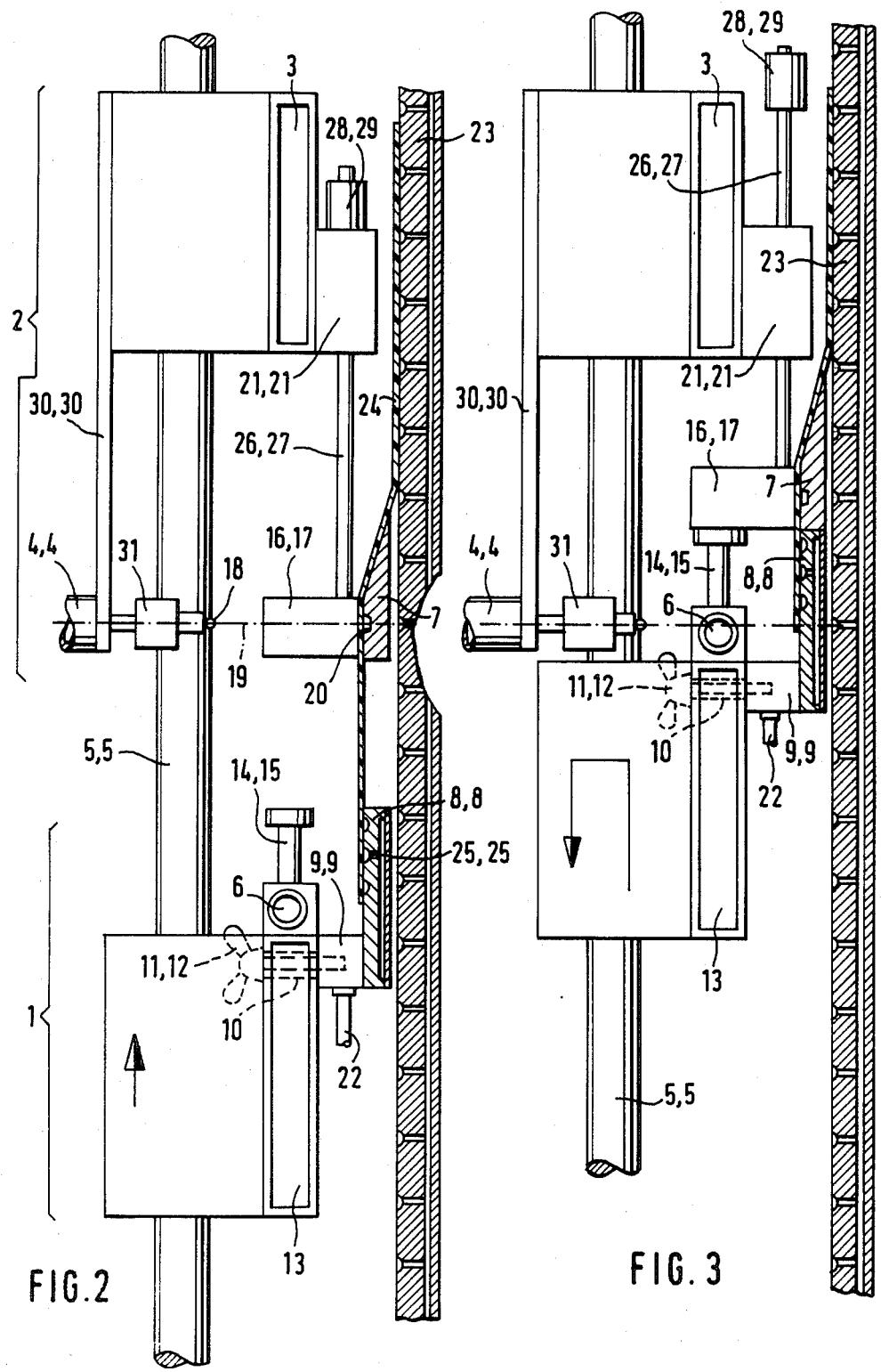

METHOD AND APPARATUS FOR GRIPPING AND CUTTING A LAMINATION FILM

BACKGROUND OF THE INVENTION

The present invention relates to a laminating device, and especially to a gripper mechanism of a laminating device having a movable gripper bar for holding and transporting a film which is cut by a cutting mechanism to a given length and laminated onto a base. The present invention also relates to the process by which the laminating device performs.

Before bases, such as printed circuit boards, multi-layer films, metal plates or substrates having two-sided vapor-deposited and/or bonded metal films applied thereto, are laminated with a photoresist film, the latter is stretched free of folds on horizontally or vertically aligned suction plates of suction tables. The film is then cut to the desired shape which is necessary for a congruent lamination of the photoresist film onto the respective base.

Laminating devices are described in laid-open European Patent Application Nos. 0,040,842, 0,040,843 and 0,041,642, in which a substrate or a base is laminated on both sides with a dry resist by the application of pressure. The dry resist films are drawn off supply rolls, one of which is provided for each side of the base to be laminated. The base, for example, may be a printed circuit board. The base and resist films are then fed to a pair of laminating drums, through the nip of which the two dry resist films and the interposed base pass.

In U.S. patent application Ser. No. 740,831, a movable gripper bar, which is connected to a vacuum pump via a flexible vacuum line, is proposed for holding and transporting a photoresist film via the suction plate of a vacuum table. The gripper bar is connected to two guides, which are displaceable along guide rods with the aid of a drive chain. A strip-shaped section of the photoresist film is seized by the elevated gripper bar and transported downwardly. The photoresist film then covers an upper vacuum table, the nip of the laminating station and a lower vacuum table. The entire length of stretched photoresist film corresponds to the size of the board areas to be laminated. A vacuum is built up in both vacuum tables so that the photoresist film may be carried free of folds via the suction plates of the vacuum tables. As soon as the gripper bar has reached its end position, the vacuum tables remain subjected to suction air and the photoresist film thereby stays stretched free of folds on the suction plates of the vacuum tables. In the case of this proposed gripper mechanism, the gripper bar seizes the photoresist layer of the photoresist film. However, this seizure may lead to impressions on the photoresist layer caused by the vacuum to which the gripper bar is subjected. In addition, the mechanical effect of the gripper bar on the photoresist layer may lead to fine splinterings in the photoresist layer, if the latter is slightly embrittled by lengthy storage. Both the impressions made by the gripper bar in the photoresist layer and the splinterings of photoresist material obviously impair the quality of the photoresist layer.

SUMMARY OF THE INVENTION

Therefore, an object of the present invention is to provide an improved gripper mechanism of the type described above such that damage of the photoresist layer in seizing and transporting the photoresist film is substantially avoided.

Thus, in accordance with one aspect of the present invention, there is provided a gripper mechanism of a laminating device for holding and transporting a film to be cut and laminated onto a base, comprising a cross strut, at least two vacuum grippers, the grippers being horizontally displaceable and fixable along the cross strut, vertical guide bars for vertically positioning the gripper mechanism, a blow pipe positioned above and extending along the cross strut, the blow pipe comprising a plurality of openings in the direction of the at least two vacuum grippers, and stop screws positioned on the upper side of the blow pipe.

In a preferred embodiment, each of the at least two vacuum grippers comprises at least one shaped bore subjected to a vacuum, which includes a grid of interconnected grooves attached to a vacuum pump and a plurality of bearing surfaces interposed between the grooves.

In accordance with another aspect of the present invention, there is provided a laminating device, comprising a gripper mechanism which includes a cross strut, at least two vacuum grippers, the grippers being horizontally displaceable and fixable along the cross strut, vertical guide bars for vertically positioning the gripper mechanism, a blow pipe positioned above and extending along the cross strut, the blow pipe comprising a plurality of openings in the direction of the at least two vacuum grippers, and stop screws positioned on the upper side of the blow pipe; a cutting mechanism positioned above the gripper mechanism, which includes fastening elements, a cutting bar attached to the fastening elements, and cutting means operatively engageable with the cutting bar; and a suction plate positioned adjacent the gripper mechanism and the cutting mechanism.

In a preferred embodiment of this aspect of the present invention, the vacuum grippers have shaped bores which can be subjected to a vacuum on the side facing away from the suction plate, while the side of the vacuum grippers facing toward the suction plate does not have any shaped bores and is adjacent the suction plate with a distance of up to 2 mm therebetween.

In a further embodiment of the present invention, the cutting bar is tapered upward and toward the suction plate. The tapered cutting bar raises a film which is in contact with the suction plate from the suction plate surface as the cutting bar is moved upwardly along the suction plate.

In still another embodiment of the invention, the fastening elements on which the cutting bar is attached, are fastened at the lower ends of rods which slide in linear guides. The linear guides are connected to a tie-bar of the stable cutting mechanism.

At the upper ends of the rods, stop blocks are expediently fastened. The stop blocks are located above the linear guides and limit the downward movement of the rods in the linear guides.

To ensure a satisfactory cut of the film, the cutting bar contains a cutting groove in the cutting plane, into or out of which a horizontally displaceable heated cutting wire moves after cutting through the film resting on the cutting bar.

For adjustment of the vacuum grippers over the width of the film, the cross strut has a horizontal slot through which thumb screws extend. The thumb screws are in engagement with the fastening elements on which the vacuum grippers are fastened.

According to still another aspect of the present invention, there is provided a method for cutting a film for lamination onto a base, comprising the steps of placing a film to be laminated onto a suction plate, positioning a cutting bar of a cutting mechanism between the film and the suction plate, positioning a gripper mechanism at the lower end of the film, the gripper mechanism comprising at least two vacuum grippers, wherein the vacuum grippers are positioned below the cutting bar and between the film and the suction plate, vertically raising the vacuum grippers until the gripper mechanism engages the lower edge of the cutting mechanism, blowing air from a blow pipe of the gripping mechanism against the film to bring the film into contact with the vacuum grippers, subjecting the film to a vacuum, transporting the film downwardly from the suction plate and over the cutting bar by lowering the gripping mechanism, and cutting the film at a predetermined length.

Further objects, features and advantages of the present invention will become more apparent from the detailed description of preferred embodiments which follow, when considered with the attached figures of drawing.

BRIEF DESCRIPTION OF THE DRAWING

In the drawing:

FIG. 2 shows a side view in section of the gripper mechanism and of the cutting mechanism at the beginning of the upward movement of the gripper bar of the gripper mechanism, and FIG. 3 shows a side view in section similar to FIG. 2, with elevated gripper bar in a position in which the reverse side of the film is held by the gripper bar and the downward movement of the gripper bar begins.

DETAILED DESCRIPTION OF PREFERRED EMBODIMENTS

Figure 1:
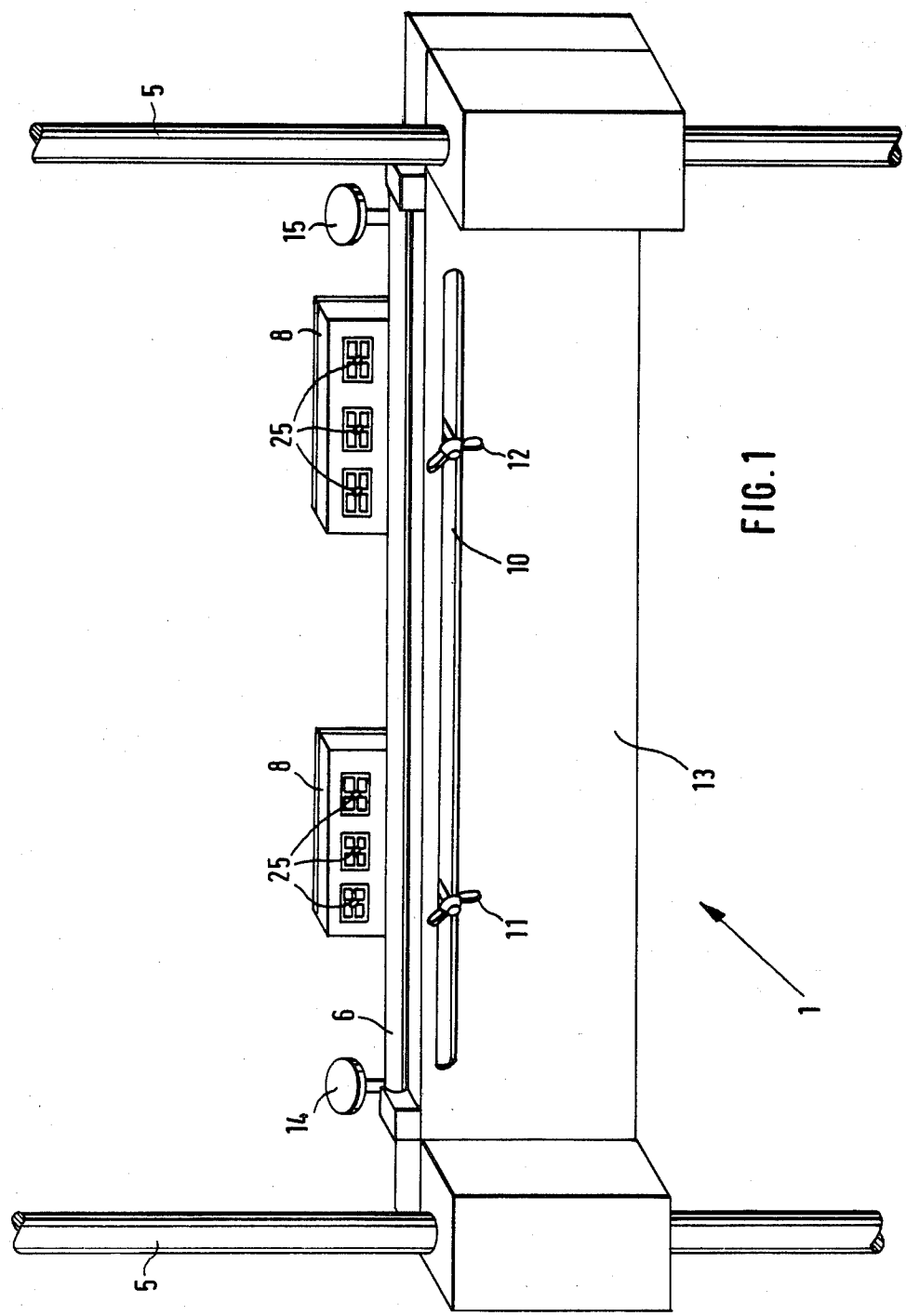
FIG. 1 shows a perspective partial view of the gripper mechanism according to the present invention.

The objects of the present invention are achieved by a gripper mechanism which has at least two vacuum grippers which are horizontally displaceable and fixable along a cross strut of the gripper mechanism. The gripper mechanism is movable up and down along vertical guide rods and includes a blow pipe which is positioned above and which extends over the width of the cross strut. An air stream is expelled from the openings of the blow pipe in the direction of the vacuum grippers. Additionally, stop screws are arranged on the upper side of the blow pipe in the vicinity of the faces of the blow pipe. The stop screws come into contact, upon raising of the gripper mechanism, with the underside of vertically displaceable fastening elements which have a cutting bar fastened thereto. The gripper mechanism then serves to raise the fastening elements with it as it is raised along the photoresist-free reverse side of the film.

FIG. 1 shows a perspective view of a part of a gripper mechanism 1, which has at least two vacuum grippers 8,8 which are horizontally displaceable along a cross strut 13 of the gripper mechanism and can be fixed with the aid of thumb screws 11 and 12, knurled-head screws or the like. The vacuum grippers 8,8 together with the cross strut 13 form the so-called gripper bar for holding and transporting a material to be cut, for example, a photoresist film 24, which is illustrated in FIGS. 2 and 3 but, for reasons of clarity, not in FIG. 1.

The gripper mechanism 1 is vertically movable along vertical guide rods 5,5, as is described, for example, in detail in U.S. patent application Ser. No. 740,831.

The vacuum grippers 8,8 are equipped on the side facing the reverse side of the photoresist film 24 with shaped bores 25,25 which are subjected to a vacuum for holding the photoresist film 24. The shaped bores 25,25 are arranged in lines and rows and are connected to grooves grouped together in parallel. The lowest point of each shaped bore is connected via a bore, which is not shown, by a vacuum line to a vacuum pump. The individual shaped bore is arranged centrally in the groove system described above and is enclosed by quadratic area sections which form the bearing surfaces for the photoresist film 24 and prevent the drawing-in of the photoresist film into the groove system. This ensures that the suction area for the photoresist film is identical to the area of the vacuum gripper 8 which is enclosed by the outer grooves of the groove system.

The cross strut 13 has a horizontal slot 10, through which the thumb screws 11 and 12 or the like extend. The thumb screws 11, 12 engage the fastening elements 9,9 (cf. FIGS. 2 and 3), on which the vacuum grippers 8,8 are fastened. By loosening the nuts of the thumb screws 11 and 12 or the like, the latter may be displaced in the slot 10 toward each other or away from each other and the distance between the vacuum grippers 8,8 associated with the thumb screws 11 and 12 or the like can thereby be freely chosen to adapt the positions of the vacuum grippers to the respective width of the photoresist film 24 to be processed. Although not shown in detail, more than two vacuum grippers 8,8 may also be provided, for example, three or four such vacuum grippers may be utilized. The number of the vacuum grippers is chosen to correspond to the width of the photoresist film 24 to be processed.

A blow pipe 6 extends above and along the width of the cross strut. The openings of the blow pipe are directed at the vacuum grippers 8,8. Outside the blow pipe 6, but in the vicinity of the faces of the blow pipe, stop screws 14 and 15 are arranged, the function of which will be described in further detail below.

FIG. 2 shows a side view in section of the gripper mechanism 1 and of the cutting mechanism 2, the gripper mechanism assuming its lower position. The arrow in FIG. 2 indicates the direction in which the gripper mechanism 1 is moved along the guide rods 5,5. Above the cross strut 13 is the blow pipe 6, above which one of the stop screws 14 and 15 can be seen. One of the thumb screws 11 and 12 is indicated in broken lines with its wing nut. The thumb screw passes through the covered slot and is in engagement with the associated fastening element 9. Attached to the fastening element 9 in each case is one of the vacuum grippers 8,8, the shaped bores 25 of which face away from the suction plate 23.

Above and at a distance from the gripper mechanism 1, the cutting mechanism 2 is stably attached on the tie-bar 3. The tie-bar 3 comprises, for example, a square tube. In a manner not shown, this square tube connects guides to one another which are vertically displaceable along the guide rods 5,5 and are fixable in a given position. Attached to the tie-bar 3 are two vertical struts 30,30. Fastened at the lower end at the front side of these vertical struts in each case is a double-acting guide cylinder 4. The piston rods of the horizontally directed guide cylinders 4,4 pass through the vertical struts 30,30 and are mounted in a square tube 31, to which a heated cutting wire 18 is fastened. The cutting wire 18 runs, in sectional view, perpendicular to the plane of observation. Through the guide cylinders 4,4, the cutting wire 18 is moved back and forth in a cutting plane 19 upon extension of the piston rods of the guide cylinders.

Connected to the tie-bar 3 are linear guides 21,21, which have guide bores for rods 26,27, in which the rods can slide up and down vertically. At the lower ends of the rods 26,27 are attached fastening elements 16,17, to which a cutting bar 7 is fastened. The cutting bar 7 contains a cutting groove 20 in the cutting plane 19. After cutting through the photoresist film 24 resting on the cutting bar 7, the heated cutting wire 18 of the cutting mechanism 2, which is horizontally displaceable by means of the guide cylinders 4,4, moves into the cutting groove 20 and, shortly thereafter, out of this cutting groove. At the upper ends of the rods 26,27 are fastened stop blocks 28,29, which lie above the linear guides 21,21 and limit the downward movement of the rods 26,27 in the linear guides 21,21 as they come into contact with the upper faces of the linear guides.

The cutting bar 7 is tapered upward and toward the suction plate 23 so that the photoresist film 24 in contact with the suction plate 23 above the cutting bar is raised from the suction plate surface by the taper of the cutting bar 7. The fastening elements 16 and 17 extend in the horizontal direction into the vertical path of movement of the gripper mechanism 1, so that, upon vertical elevation of the gripper mechanism 1, the stop screws 14 and 15 come into contact against the undersides of the fastening elements 16 and 17.

In FIG. 3, the gripper mechanism 1 is illustrated in its upper vertical position, in which the gripper mechanism 1 is in contact by its stop screws 14 and 15 with the underside of the vertically displaceable fastening elements 16 and 17 and raise the latter with them upon elevation. In this position, the vacuum grippers 8,8 are also in contact with the underside of the cutting bar 7 by their upper sides. The blow pipe 6 above the cross strut 13 is then located in the cutting plane 19 so that the blown air leaving the blow pipe 6 hits the photoresist layer of the photoresist film 24 and presses the latter, by the photoresist-free reverse side, against the shaped bores 25,25 of the vacuum grippers 8,8. As soon as the vacuum grippers are subjected to suction air, the photoresist film 24 is in contact with the vacuum grippers 8,8 in a fold-free manner. The film is held by the vacuum grippers and pulled down with them into the position shown in FIG. 2. In the cutting plane 19, cutting of the photoresist film 24 is performed by means of the heated cutting wire 18. During the further downward movement of the vacuum grippers 8,8, the cut-off photoresist film 24 flicks off over the edge of the cutting bar 7 and comes to rest against the suction plate 23, which is subject to a vacuum and stretches the photoresist film 24 free of folds.

In the lower end position of the gripper mechanism 1, the suction air of the vacuum grippers 8,8 is switched off and the gripper mechanism 1 lowered further until the lower edge of the photoresist film 24 can also be sucked against the suction plate 23. As soon as a base has been laminated with the cut-off photoresist film 24, the gripper mechanism 1 is elevated again and a new holding and transporting cycle begins with the photoresist film 24.

To avoid repetition, the components in FIG. 3 corresponding to the components in FIG. 2 are not repeated in FIG. 3.

What is claimed is:

1. A device, comprising:
   means for transporting a predetermined length of film having a photoresist-free side and a photoresist side in a transport direction; and
   means for cutting the film at the predetermined length to provide a cut film and a residual uncut film; wherein said device comprises:
   a suction plate having a generally planar surface and a suction means operable to selectively hold the film against the generally planar surface; and
   a gripper mechanism comprising,
     means for holding a portion of the film at which the cutting means cuts the film, the holding means including a cutter bar,
     a vacuum means for subjecting the photoresist-free side of the film to a vacuum,
     means for guiding the vacuum means reciprocally along and opposite to the transport direction of the film,
     means for moving the vacuum means along the guide means to transport the film past the cutting means until the predetermined length of film has been positioned for cutting,
     means for blowing air against the photoresist side of the film, the blowing means being spaced opposite and movable with the vacuum means whereby air is blown by the blowing means against the photoresist side of the film to move the photoresist-free side of the film against the vacuum means where the film is subjected to a vacuum and held, and
     means for displacing the holding means away from the edge of the uncut film after each predetermined length of film has been cut, the displacing means being connected to the blowing means, whereby the blowing means and the vacuum means are moved opposite to the direction of transportation after each predetermined length of film has been cut to engage the uncut film and the displacing means displaces the holding means as the blowing means and the vacuum means move into position to engage the film.

2. A device as claimed in claim 1 wherein the vacuum means comprises a cross strut transversely positioned to the direction of transportation of the film and a vacuum gripper axially displaceable along the cross strut and selectively fixable thereto.

3. A device as claimed in claim 2 wherein the vacuum means further comprises a second vacuum gripper axially displaceable along the cross strut and selectively fixable thereto.

4. A device as claimed in claim 3 wherein the blowing means comprises a blow pipe attached to the cross strut and extending in the axial direction of the cross strut, the blow pipe having a plurality of openings facing the two vacuum grippers.

5. A device as claimed in claim 3 wherein each of the two vacuum grippers comprise shaped bores facing the suction plate, the shaped bores including a grid of interconnected grooves attached to a vacuum pump, and a plurality of bearing surfaces interposed between the grooves, the side of the vacuum grippers which faces the suction plate having no shaped bores and spaced from the suction plate at a distance of up to 2 mm.

6. A device as claimed in claim 2 wherein the cross strut includes a horizontal slot.

7. A device as claimed in claim 6 wherein each of the vacuum grippers comprises a fastening element and thumb screws, the thumb screws adapted to extend through the horizontal slot of the cross strut to engage the fastening elements and thereby fastening the vacuum grippers to the cross strut.

8. A device as claimed in claim 1 wherein the cutting means is operatively engagable with the cutter bar and the gripper mechanism is positioned below the cutting means.

9. A device as claimed in claim 1 wherein the cutter bar is adjacent the suction plate and tapers along its upper edge in the direction of the suction plate.

10. A device as claimed in claim 1 wherein the cutter bar and the vacuum means are positionable between the suction plate and the uncut portion of the film and the cutter bar is adapted to raise the uncut portion of the film from the generally planar surface of the suction plate.

11. A device as claimed in claim 7 wherein the cutting means comprises a tie-bar, a stop lock, at least two linear guides connected to the tie-bar and a rod vertically positionable in each of the linear guides and whereby the fastening elements are attached to the linear guides and a stop lock is attached to the upper ends of each of the rods above the linear guides.

12. A device as claimed in claim 1 wherein the cutting means comprises a heated cutting wire and the cutter bar comprises a cutting groove adapted to receive the heated cutting wire.

13. A method for cutting a film for lamination onto a base, comprising the steps of:
  placing a film to be laminated onto a suction plate;
  positioning a cutting bar of a cutting mechanism between said film and said suction plate;
  positioning a gripper mechanism at the lower end of said film, said gripper mechanism comprising at least two vacuum grippers, wherein said vacuum grippers are positioned below said cutting bar and between said film and said suction plate;
  vertically raising said vacuum grippers until said gripper mechanism engages the lower edge of said cutting mechanism;
  blowing air from a blow pipe of said gripping mechanism against said film to bring said film into contact with said vacuum grippers;
  subjecting said film to a vacuum;
  transporting said film downwardly from said suction plate and over said cutting bar by lowering said gripping mechanism; and
  cutting said film at a predetermined length.

* * * * *